(12) United States Patent
Narushima et al.

(10) Patent No.: US 10,316,410 B2
(45) Date of Patent: Jun. 11, 2019

(54) METHOD OF FILLING RECESSES IN SUBSTRATE WITH TUNGSTEN

(71) Applicant: TOKYO ELECTRON LIMITED, Tokyo (JP)

(72) Inventors: Kensaku Narushima, Nirasaki (JP); Katsumasa Yamaguchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 23 days.

(21) Appl. No.: 15/697,751

(22) Filed: Sep. 7, 2017

(65) Prior Publication Data

US 2018/0073141 A1 Mar. 15, 2018

(30) Foreign Application Priority Data

Sep. 13, 2016 (JP) .................. 2016-178638

(51) Int. Cl.
*C23C 16/455* (2006.01)
*C23C 16/14* (2006.01)
*C23C 16/04* (2006.01)

(52) U.S. Cl.
CPC ...... *C23C 16/45527* (2013.01); *C23C 16/045* (2013.01); *C23C 16/14* (2013.01); *C23C 16/45553* (2013.01)

(58) Field of Classification Search
CPC .............................. C23C 16/45525–16/45527
See application file for complete search history.

(56) References Cited

U.S. PATENT DOCUMENTS

2015/0279735 A1* 10/2015 Hotta ................. H01L 21/28556
                                                      438/656
2016/0284553 A1*  9/2016 Suzuki .............. H01L 21/76883
2017/0350008 A1* 12/2017 Collins ............. C23C 16/45525

FOREIGN PATENT DOCUMENTS

JP    2011-035366 A    2/2011
JP    2015-038964 A    2/2015
JP    2015-512568 A    4/2015

* cited by examiner

*Primary Examiner* — Elizabeth A Burkhart
(74) *Attorney, Agent, or Firm* — Nath, Goldberg & Meyer; Jerald L. Meyer (57) ABSTRACT

A method of filling recesses in a substrate with tungsten includes preparing the substrate within a chamber of a film forming apparatus, performing a first cycle at least once, the first cycle comprising introducing a tungsten-containing precursor gas into the chamber, purging the chamber, introducing a hydrogen-containing gas into the chamber, and purging the chamber, and performing a second cycle at least once after the first cycle is performed at least once, the second cycle comprising introducing the tungsten-containing precursor gas into the chamber, purging the chamber, introducing the hydrogen-containing gas into the chamber, and purging the chamber. A pressure in the chamber when the second cycle is performed is set to a pressure lower than a pressure in the chamber when the first cycle is performed.

12 Claims, 8 Drawing Sheets

METHOD OF FILLING RECESSES IN SUBSTRATE WITH TUNGSTEN

CROSS-REFERENCE TO RELATED APPLICATION

This application is based upon and claims the benefit of priority from Japanese Patent Application No. 2016-178638, filed on Sep. 13, 2016, the entire contents of which are incorporated herein by reference.

TECHNICAL FIELD

The present disclosure relates to a method of filling recesses in a substrate with tungsten.

BACKGROUND

In fabricating an electronic device such as a semiconductor device, there is a case where recesses in a substrate are filled with tungsten. The process of filling the recesses in the substrate with tungsten is performed, for example, in fabricating a three-dimensional NAND type memory device.

For example, there have been known methods of filling recesses with tungsten to prevent occurrence of defects such as voids. These methods include embodiment of the recesses with tungsten and etching of the tungsten. Specifically, these methods include forming a tungsten layer on a surface forming and defining the recesses, etching off regions of the tungsten layer causing defects, and subsequently forming another tungsten layer again.

The known methods described above are inefficient because switching is made between the film formation and the etching. Accordingly, in the process of filling the recesses with tungsten, there is a need for improving efficiency while limiting the occurrence of defects.

SUMMARY

Some embodiments of the present disclosure provide a method of capable of limiting the occurrence of defects while improving efficiency in filling the recesses with tungsten.

According to one embodiment of the present disclosure, there is provided a method of filling recesses in a substrate with tungsten, including: preparing the substrate within a chamber of a film forming apparatus; performing a first cycle at least once, the first cycle comprising introducing a tungsten-containing precursor gas into the chamber, purging the chamber, introducing a hydrogen-containing gas into the chamber, and purging the chamber; and performing a second cycle at least once after the first cycle is performed at least once, the second cycle comprising introducing the tungsten-containing precursor gas into the chamber, purging the chamber, introducing the hydrogen-containing gas into the chamber, and purging the chamber; wherein a pressure in the chamber when the second cycle is performed is set to a pressure lower than a pressure in the chamber when the first cycle is performed.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, various embodiments of the present disclosure will be described in detail with reference to the accompanying drawings. Identical or similar elements are indicated by like reference numerals throughout the figures. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
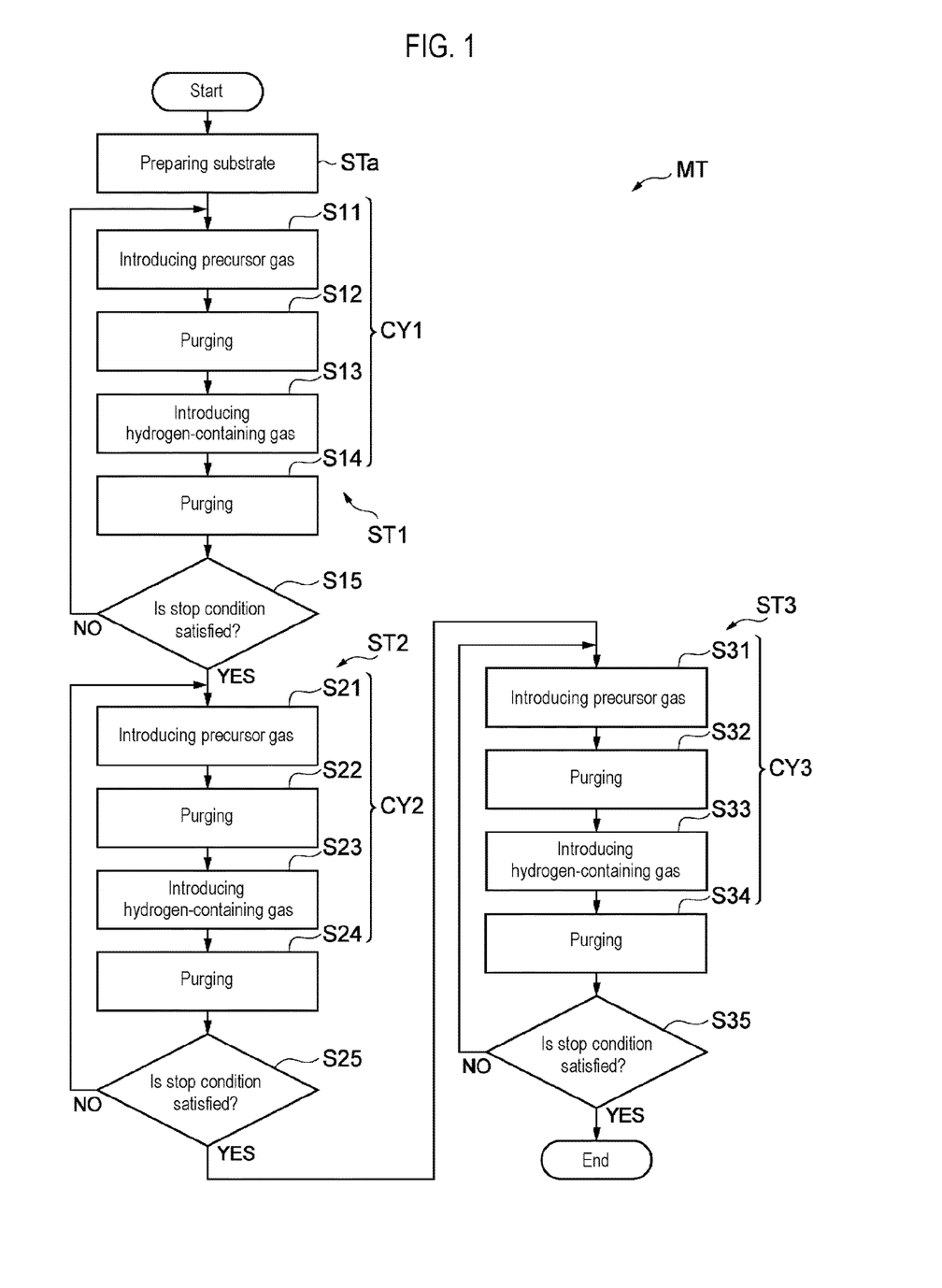
FIG. 1 is a flowchart showing a method according to one embodiment of the present disclosure.

FIG. 1 is a flowchart showing a method according to one embodiment of the present disclosure. The method MT shown in FIG. 1 is a method of filling recesses in a substrate with tungsten. In the method MT, a process STa is first performed. In the process STa, the substrate is prepared within a chamber of a film forming apparatus.

Figure 2:
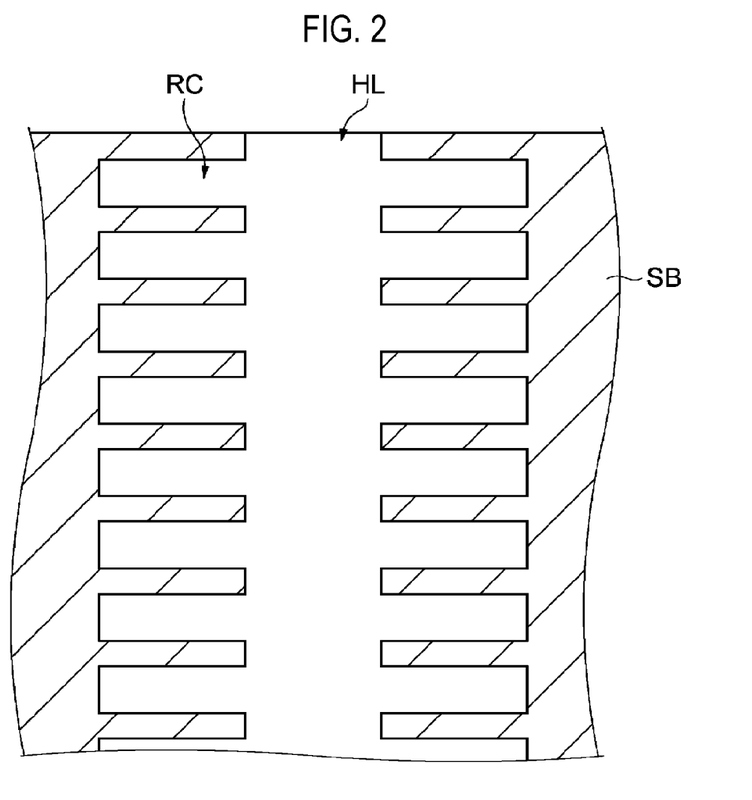
FIG. 2 is an enlarged sectional view showing a portion of a substrate to which the method shown in FIG. 1 can be applied.

FIG. 2 is an enlarged sectional view showing a portion of the substrate to which the method shown in FIG. 1 can be applied. The substrate SB shown in FIG. 2 has, for example, a disk shape. A trench HL is formed in the substrate SB. The trench HL is formed to extend from an upper surface of the substrate SB in a thickness direction of the substrate SB. In addition, a plurality of recesses RC is formed in the substrate SB. The plurality of recesses RC is formed to extend on both sides of the trench HL in a width direction of the trench HL.

Figure 3:
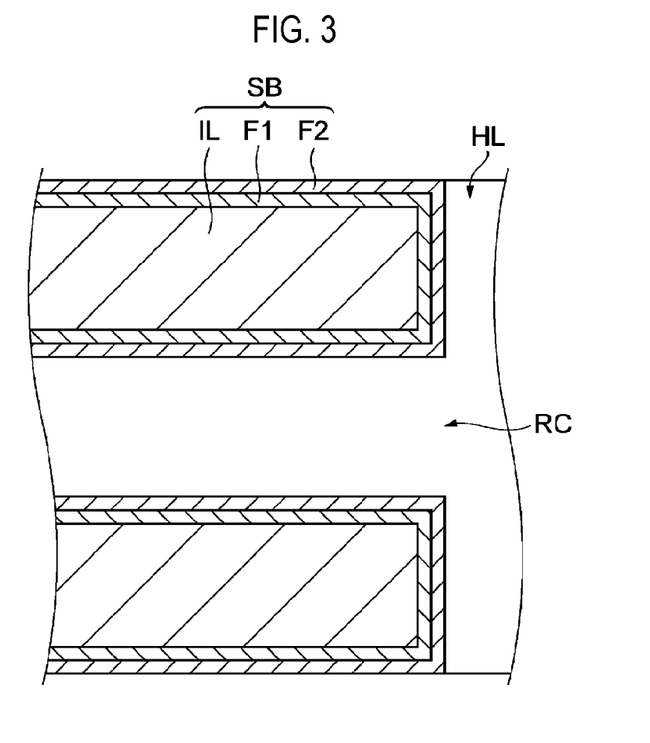
FIG. 3 is a further enlarged sectional view showing the portion of the substrate shown in FIG. 2.

FIG. 3 is a further enlarged sectional view showing the portion of the substrate shown in FIG. 2. As shown in FIG. 3, the substrate SB may have an insulating layer IL, a first film F1 and a second film F2. The insulating layer IL is formed of, for example, silicon oxide. The first film F1 is formed of, for example, insulative ceramics and covers a surface of the insulating layer IL. The second film F2 is formed of a barrier metal and covers a surface of the first film F1. In fabricating the substrate SB, the insulating layer IL in which holes and recesses are provided by plasma etching is formed, and the first film F1 and the second film F2 are then formed in this order, thereby fabricating the substrate SB.

Figure 4:
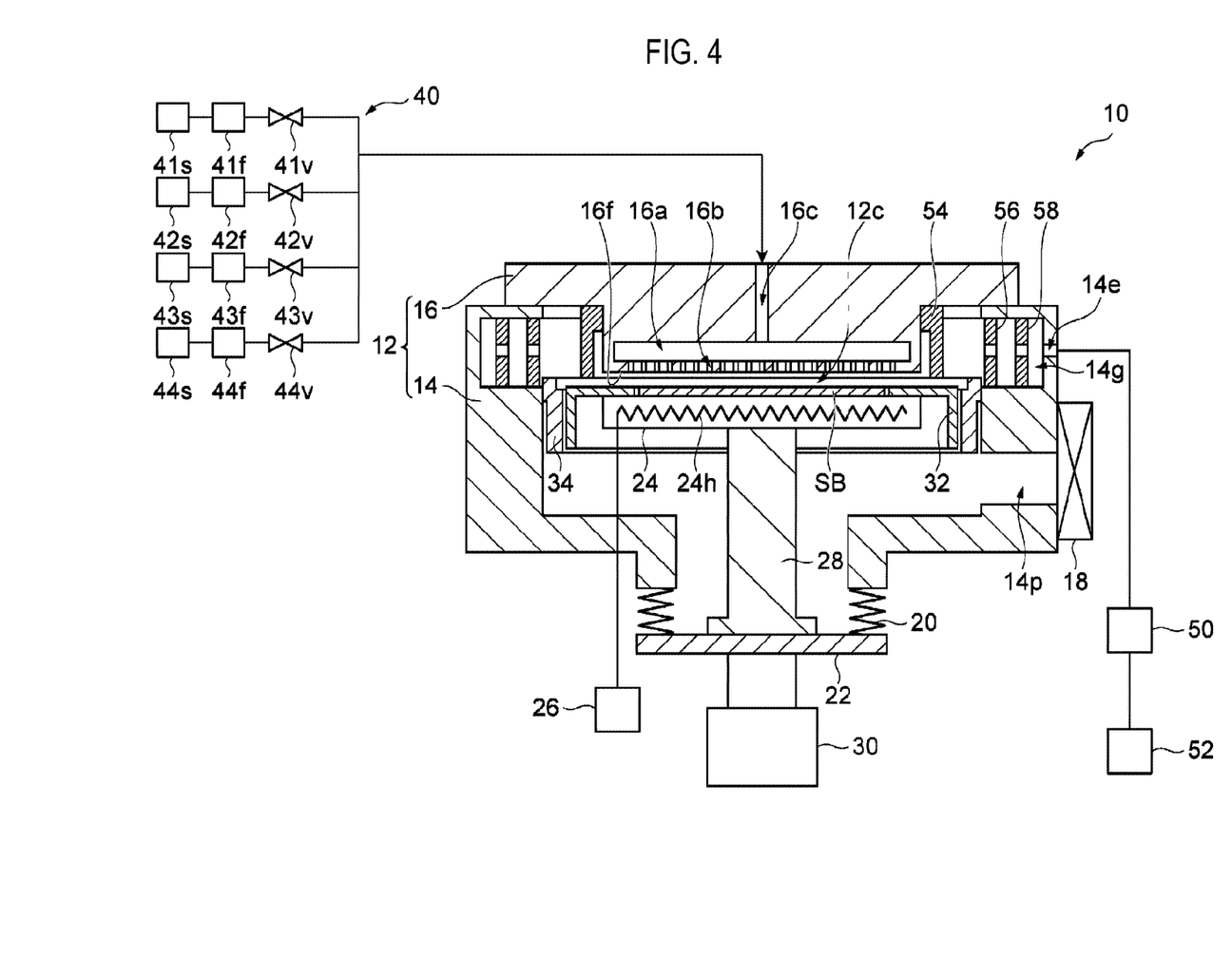
FIG. 4 is a view schematically showing a film forming apparatus according to one embodiment which can be utilized to perform the method shown in FIG. 1.

FIG. 4 is a view schematically illustrating a film forming apparatus according to one embodiment which can be utilized to perform the method shown in FIG. 1. The film forming apparatus 10 shown in FIG. 4 has a chamber main body 12. An internal space of the chamber main body 12 serves as a chamber 12c. The chamber main body 12 has a main part 14 and a ceiling part 16. The main part 14 constitutes a sidewall of the chamber main body 12. The main part 14 has a substantially cylindrical shape and extends vertically. The main part 14 is formed of, for example, a metal such as aluminum. A corrosion-resistant film is formed on an inner wall surface of the main part 14.

An opening 14p used for loading the substrate SB into the chamber 12c and unloading the substrate SB out of the chamber 12c is formed in the main part 14, i.e., in a sidewall of the chamber main body 12. This opening 14p is configured to be opened/closed by a gate valve 18. A lower end of the main part 14 is open, and one end (upper end) of a bellows 20 is coupled to the lower end of the main part. The other end (lower end) of the bellows 20 is coupled to a lid 22. The lid 22 has a generally plate-shaped member. The bellows 20 and the lid 22 seal the open lower end of the main part 14 so as to secure airtightness of the chamber 12c. In addition, an upper end of the main part 14 is open and the ceiling part 16 is coupled to the upper end of the main part. The ceiling part 16 seals the open upper end of the main part 14 so as to secure the airtightness of the chamber 12c. The ceiling part 16 is formed of, for example, a metal such as aluminum. A corrosion-resistant film is formed on an inner wall surface of the ceiling part 16.

A stage 24 is installed within the chamber 12c. The stage 24 is generally disk-shaped. The substrate SB is mounted on an upper surface of the stage 24. A heater 24h is built in the stage 24. The heater 24h is electrically connected to a heater power supply 26. The heater power supply 26 is provided outside the chamber main body 12.

One end (upper end) of a shaft body 28 is coupled to the stage 24. The shaft body 28 extends downward below the stage 24. The other end (lower end) of the shaft body 28 is coupled to the lid 22. A driving device 30 provided outside the chamber main body 12 is coupled to the lid 22. The driving device 30 is configured to move the stage 24 upward/downward via the lid 22 and the shaft body 28. The driving device 30 may have, for example, a motor and a driving shaft coupled to the motor in order to move the stage 24 upward/downward.

A ring member 32 is provided in the stage 24. An upper portion of the ring member 32 defines a circular opening. The ring member 32 is provided such that the upper portion thereof surrounds the substrate SB mounted on the stage 24. A cylinder body 34 is provided on the main part 14, i.e., on the sidewall of the chamber main body 12. The cylinder body 34 has a generally cylindrical shape and is installed inside the chamber 12c and outside the ring member 32. The cylinder body 34 is installed coaxially with the ring member 32 such that a slight clearance is interposed between the cylinder body 34 and the ring member 32.

The ceiling part 16 includes a wall surface 16f that defines the chamber 12c from above. The wall surface 16f extends over the stage 24 and faces the upper surface of the stage 24. The film forming apparatus 10 is configured to allow the length of a gap between the upper surface of the stage 24 and the wall surface 16f to be changed by the upward/downward movement of the stage 24 described above.

A gas diffusion chamber 16a is formed within the ceiling part 16. In addition, a plurality of gas discharge holes 16b is formed in the ceiling part 16. The plurality of gas discharge holes 16b is holes used for discharging gases supplied to the gas diffusion chamber 16a into the chamber 12c and extends from the gas diffusion chamber 16a to the wall surface 16f. A gas line 16c is also formed in the ceiling part 16. The gas line 16c is connected to the gas diffusion chamber 16a. A gas supply system 40 is connected to the gas line 16c.

The gas supply system 40 includes flow rate controllers 41f, 42f, 43f and 44f and valves 41v, 42v, 43v and 44v. Each of the flow rate controllers 41f, 42f, 43f and 44f is a mass flow controller or a pressure-controlled flow rate controller. A gas source 41s is connected to an inlet of the flow rate controller 41f. The gas source 41s is a source of a precursor gas. The precursor gas is a gas containing tungsten. For example, the precursor gas is a gas containing a tungsten halide. The tungsten halide is, for example, $WCl_6$. The tungsten halide may be $WCl_5$ or $WF_6$. An outlet of the flow rate controller 41f is connected to the gas line 16c via the valve 41v.

A gas source 42s is connected to an inlet of the flow rate controller 42f. The gas source 42s is a source of a carrier gas. The carrier gas is an inert gas. The inert gas used as the carrier gas is $N_2$ gas. In addition, the inert gas used as the carrier gas may be a rare gas such as Ar gas. An outlet of the flow rate controller 42f is connected to the gas line 16c via the valve 42v.

A gas source 43s is connected to an inlet of the flow rate controller 43f. The gas source 43s is a source of a hydrogen-containing gas. The hydrogen-containing gas is $H_2$ gas. In addition, the hydrogen-containing gas may be a silane gas, for example, $SiH_4$ gas and/or $B_2H_6$. An outlet of the flow rate controller 43f is connected to the gas line 16c via the valve 43v.

A gas source 44s is connected to an inlet of the flow rate controller 44f. The gas source 44s is a source of a purge gas, i.e., an inert gas. The inert gas used as the purge gas is $N_2$ gas. In addition, the inert gas used as the purge gas may be a rare gas such as Ar gas. An outlet of the flow rate controller 44f is connected to the gas line 16c via the valve 44v.

The gas supply system 40 may control the flow rates of gases from one or more gas sources selected from the gas sources 41s, 42s, 43s and 44s and supply the flow rate-controlled gases to the gas diffusion chamber 16a. The gases supplied to the gas diffusion chamber 16a are discharged from the plurality of gas discharge holes 16b toward the substrate SB.

The main part 14, i.e., the sidewall of the chamber main body 12, defines a groove 14g extending in a circumferential direction about a central axis of the main part 14. An exhaust port 14e is formed at a portion of the main part 14 which defines the groove 14g. An exhaust device 52 is connected to the exhaust port 14e via a pressure regulating valve 50. The exhaust device 52 may be a vacuum pump such as a turbo molecular pump or a dry pump.

One or more baffle members are provided in the chamber 12c. In the film forming apparatus 10 shown in FIG. 4, three baffle members 54, 56 and 58 are provided in the chamber 12c. Each of the three baffle members 54, 56 and 58 has a generally cylindrical shape extending in a vertical direction. Three baffle members 54, 56 and 58 are coaxially provided on a center side of the chamber 12c with respect to the exhaust port 14e. An upper end of the baffle member 54 is connected to the ceiling part 16. A lower end of the baffle member 54 faces the ring member 32 so as to provide a gap between the lower end of the baffle member 54 and the ring member 32. The baffle member 56 and the baffle member 58 are disposed in the groove 14g. The baffle member 56 is provided outside the baffle member 54, and the baffle member 58 is provided outside the baffle member 56. Each of the baffle members 56 and 58 has a plurality of through-holes formed therein. The plurality of through-holes formed in each of the baffle members 56 and 58 is arranged in the circumferential direction with respect to the central axis of the main part 14.

In the film forming apparatus 10, the gases discharged from the plurality of gas discharge holes 16b are dispersed onto the substrate SB and then discharged from the exhaust port 14e via the gap between the baffle member 54 and the ring member 32, the through-holes of the baffle member 56 and the through-holes of the baffle member 58.

Figure 5:
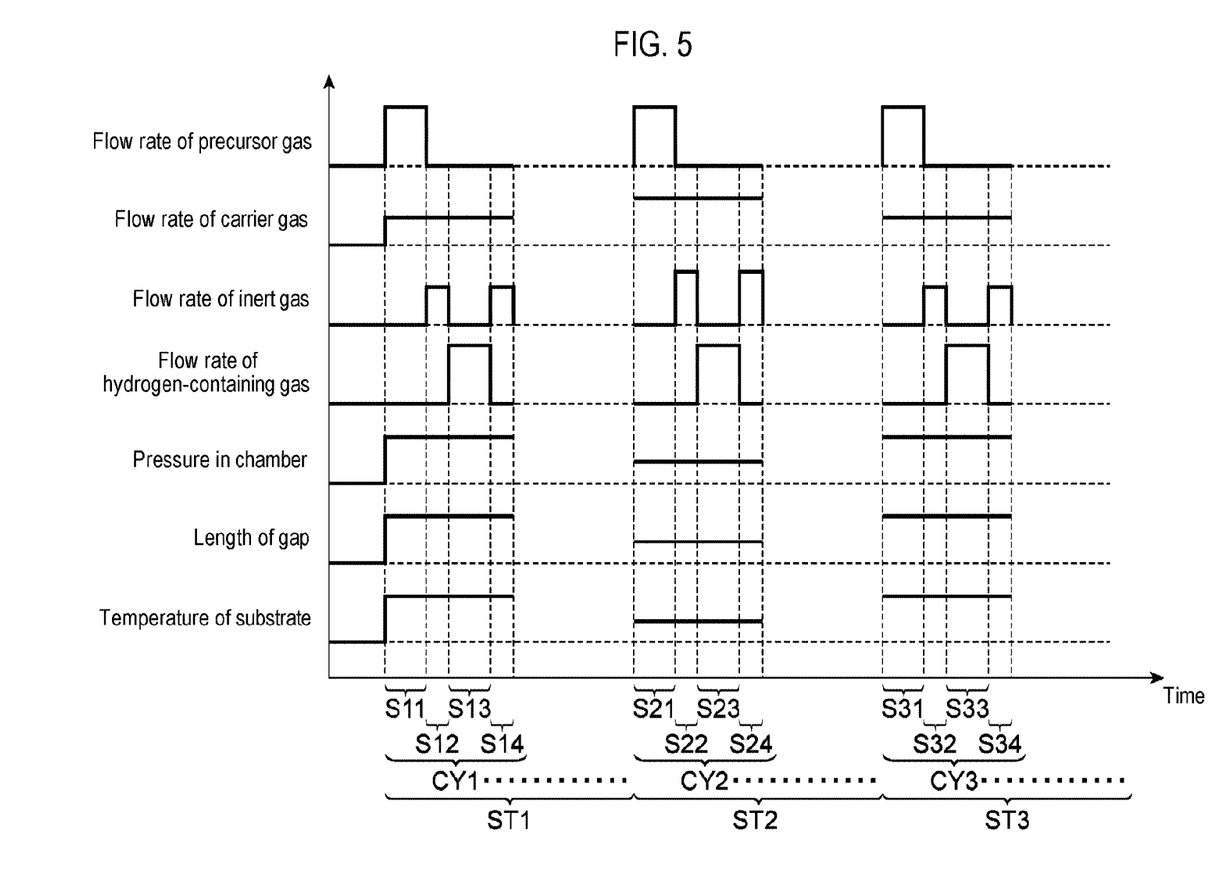
FIG. 5 is a timing chart related to the method shown in FIG. 1.
Figure 6:
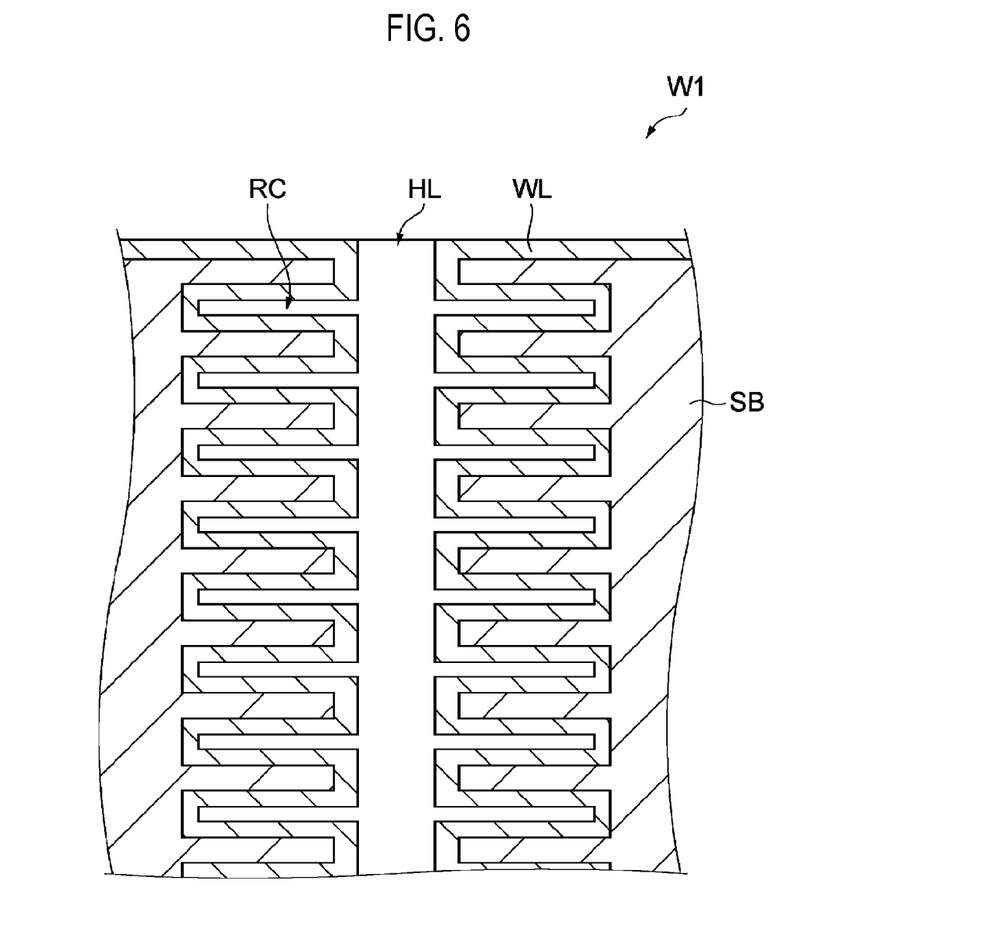
FIG. 6 is a sectional view showing a state of the substrate after performing a process ST1 of the method shown in FIG. 1.
Figure 7:
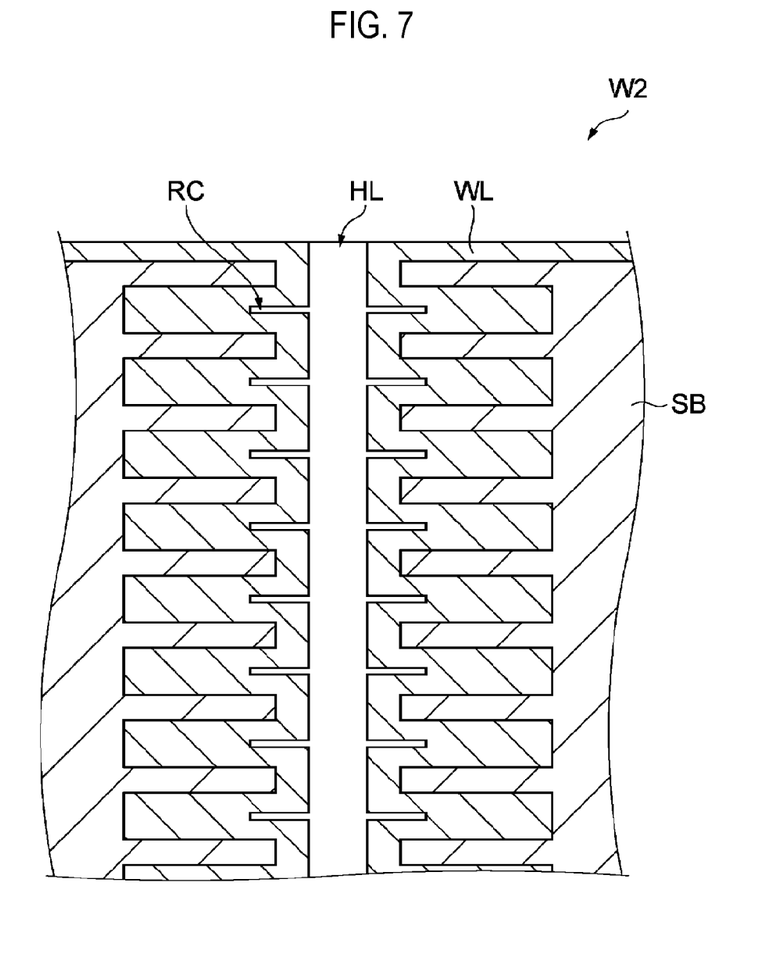
FIG. 7 is a sectional view showing a state of the substrate after performing a process ST2 of the method shown in FIG. 1.
Figure 8:
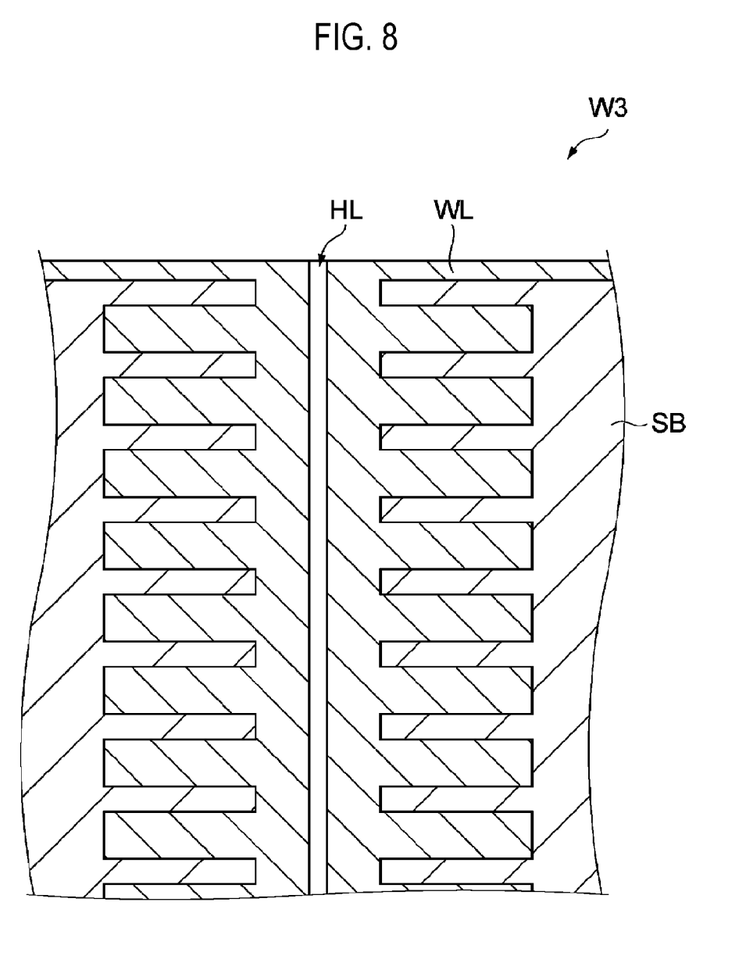
FIG. 8 is a sectional view showing a state of the substrate after performing a process ST3 of the method shown in FIG. 1.

Referring again to FIG. 1, the description on the method MT is continued. In addition to FIG. 1, the following description will be made with reference to FIGS. 5 to 8. FIG. 5 is a timing chart related to the method shown in FIG. 1. FIG. 6 is a sectional view showing a state of the substrate after performing a process ST1 of the method shown in FIG. 1. FIG. 7 is a sectional view showing a state of the substrate after performing a process ST2 of the method shown in FIG. 1. FIG. 8 is a sectional view showing a state of the substrate after performing a process ST3 of the method shown in FIG. 1. Although the method MT will be described below by way of example in connection with a case where the recesses RC of the substrate SB shown in FIG. 2 are filled with tungsten using the film forming apparatus 10, the substrate to which the method MT is applied is not limited to the substrate SB shown in FIG. 2. The substrate to which the method MT is applied may be any substrate as long as it has recesses. Further, the film forming apparatus that may be used to perform the method MT is not limited to the film forming apparatus 10 shown in FIG. 4.

In a process STa of the method MT, the substrate SB is prepared in the chamber 12c as described above. Specifically, in the process STa, the substrate SB is loaded into the chamber 12c and mounted on the upper surface of the stage 24.

Then, the process ST1 is performed in the method MT. In the process ST1, a first cycle CY1 is performed at least once. The first cycle CY is performed, for example, several times. The first cycle CY1 includes sub-processes S11, S12, S13 and S14. In the sub-process S11, the precursor gas is introduced into the chamber 12c. The precursor gas is supplied from the gas source 41s into the chamber 12c. The precursor gas is a gas containing tungsten. For example, the precursor gas is a gas containing a tungsten halide. The tungsten halide is, for example, $WCl_6$. In addition, $WCl_5$ or $WF_6$ may be employed as the tungsten halide. In the sub-process S11, the carrier gas from the gas source 42s may be introduced into the chamber 12c together with the precursor gas. The carrier gas is an inert gas and is, for example, a rare gas such as $N_2$ gas or Ar gas. Moreover, the carrier gas may be continuously introduced into the chamber 12c in the sub-process S11, the sub-process S12, the sub-process S13 and the sub-process S14. When the precursor gas is supplied into the chamber 12c in the sub-process S11, tungsten-containing molecules (for example, tungsten halide) in the precursor gas are attached to a base. The base is the surface of the substrate SB or a surface of a tungsten layer which has already been formed.

In the subsequent sub-process S12, the chamber 12c is purged. Specifically, in the sub-process S12, the inert gas which is the purge gas is supplied into the chamber 12c from the gas source 44s. When the inert gas is supplied to the chamber 12c in the sub-process S12, the tungsten-containing molecules which are excessively attached to the base are discharged together with the purge gas, and the precursor gas in the chamber 12c is replaced with the purge gas.

In the subsequent sub-process S13, the hydrogen-containing gas is introduced into the chamber 12c. The hydrogen-containing gas is supplied into the chamber 12c from the gas source 43s. The hydrogen-containing gas is $H_2$ gas. In addition, the hydrogen-containing gas may be a silane gas such as $SiH_4$ gas and/or $B_2H_6$. When the hydrogen-containing gas is supplied into the chamber 12c in the sub-process S13, unnecessary atoms (for example, halogen atoms) are removed from the tungsten-containing molecules attached to the base by reduction due to hydrogen. In the subsequent sub-process S14, the chamber 12c is purged as in the sub-process S12. By this sub-process S14, the hydrogen-containing gas in the chamber 12c is replaced with the purge gas.

In a subsequent process S15, determination is made as to whether a stop condition is satisfied. The stop condition is satisfied if the first cycle CY1 has been performed a predetermined number of times. If it is determined in the process S15 that the stop condition is not satisfied, the first cycle CY1 is repeated from the sub-process S11. Meanwhile, if the stop condition is satisfied, the process ST1 is terminated. After completion of the process ST1, i.e., after the first cycle CY1 is performed one or more times, an intermediate product W1 shown in FIG. 6 is obtained. As shown in FIG. 6, a tungsten layer WL is formed on the surface of the substrate SB by performing the process ST1, and the width of each of the recesses RC is reduced by the tungsten layer WL. The n first cycle CY1 is performed a predetermined number of times so as not to cause defects such as voids when the recesses RC are filled with tungsten.

When the first cycle CY1 is performed, a pressure in the chamber 12c is set to a relatively high pressure. By performing the first cycle CY1, it is possible to form the tungsten layer WL on the surface of the substrate SB defining the recesses RC, while limiting damage to the base (the substrate SB or the already formed tungsten layer).

In the method MT, the process ST2 is subsequently performed. In the process ST2, a second cycle CY2 is performed at least once. The second cycle CY2 is performed, for example, a plurality of times. The second cycle CY2 includes sub-processes S21, S22, S23 and S24. In the sub-process S21, the precursor gas is introduced into the chamber 12c as in the sub-process S11. In the sub-process S21, the carrier gas may be supplied into the chamber 12c together with the precursor gas. The carrier gas may be continuously introduced into the chamber 12c in the sub-process S21, the sub-process S22, the sub-process S23, and the sub-process S24. In the subsequent sub-process S22, the chamber 12c is purged as in the sub-process S12. In the subsequent sub-process S23, the hydrogen-containing gas is introduced into the chamber 12c as in the sub-process S13. In the subsequent sub-process S24, the chamber 12c is purged as in the sub-process S14. In the subsequent process S25, determination is made as to whether a stop condition is satisfied. The stop condition is satisfied if the second cycle CY2 has been performed a predetermined number of times. If it is determined in the process S25 that the stop condition is not satisfied, the second cycle CY2 is repeated from the sub-process S21. Meanwhile, if the stop condition is satisfied, the process ST2 is terminated.

As shown in FIG. 5, a pressure in the chamber 12c when the second cycle CY2 is performed is set to a pressure lower than the pressure in the chamber 12c when the first cycle CY1 is performed. Since the pressure in the chamber 12c is set to a relatively high pressure when the first cycle CY1 is performed, a mean free path is small so that the precursor gas cannot be sufficiently supplied to the recesses RC having the reduced widths. Therefore, if the recesses RC are filled with tungsten only by the first cycle CY1, defects may occur. Accordingly, in the method MT, the second cycle CY2 is performed after the first cycle CY1 is performed at least once. When the second cycle CY2 is performed, the pressure in the chamber 12c is set to a relatively low pressure, the mean free path is increased. Thus, according to the second cycle CY2, the precursor gas is supplied into the recesses RC with the reduced widths, and high coverage of tungsten to the base is obtained. Therefore, according to the method MT, it is possible to fill the recesses RC with tungsten while suppressing defects.

In one embodiment, as shown in FIG. 5, the length of the gap between the stage 24 and the wall surface 16f when the second cycle CY2 is performed is set to a distance shorter than the length of the gap between the stage 24 and the wall surface 16f when the first cycle CY1 is performed. Accordingly, the volume of the space around the substrate SB when the second cycle CY2 is performed becomes smaller than the volume around the substrate SB when the first cycle CY1 is performed. Therefore, when the second cycle CY 2 is performed, a concentration of the precursor gas around the substrate SB is increased. The coverage of tungsten to the base is further improved by performing the second cycle CY2.

In addition, in one embodiment, as shown in FIG. 5, a temperature of the substrate SB (a temperature of the stage 24) when the second cycle CY2 is performed is set to a temperature lower than a temperature of the substrate SB (a temperature of the stage 24) when the first cycle CY1 is performed. When the temperature of the substrate is low, reaction efficiency is lowered and a consumption rate of the precursor gas is reduced. Therefore, when the temperature of the substrate is low, the amount of the precursor gas supplied into the recesses RC is increased, and the coverage of tungsten to the base is increased. Therefore, by performing the second cycle CY2 in which the temperature of the substrate is set to a temperature lower than the temperature of the substrate in the first cycle CY1, the coverage of tungsten to the base is further improved.

Further, in one embodiment, as shown in FIG. 5, a flow rate of the carrier gas when the second cycle CY2 is performed is set to a flow rate larger than a flow rate of the carrier gas when the first cycle CY1 is performed. Since the flow rate of the carrier gas is increased when the second cycle CY2 is performed, the coverage of tungsten to the base is further improved.

Moreover, in one embodiment, as shown in FIG. 5, a flow rate of the purge gas when the sub-process S22 and the sub-process S24 are performed is set to a flow rate larger than a flow rate of the purge gas when the sub-process S12 and the sub-process S14 are performed. When the purge gas is supplied at such a flow rate in the sub-process S22 and the sub-process S24 of the second cycle CY2, it is possible to efficiently remove the gas remaining in the recesses RC with reduced widths when purging is performed.

After the process ST2 is performed, an intermediate product W2 shown in FIG. 7 is obtained. As shown in FIG. 7, the performance of the process ST2 causes the thickness of the tungsten layer WL to be increased and the recesses RC to be left in the form of slight slits but to have shallower depths. In other words, aspect ratios of the recesses RC become small.

In the method MT, a process ST3 is subsequently performed. In the process ST3, a third cycle CY3 is performed at least once. The third cycle CY3 is performed, for example, a plurality of times. The third cycle CY3 includes sub-processes S31, S32, S33 and S34. In the sub-process S31, the precursor gas is introduced into the chamber 12c as in the sub process S11. In the sub-process S31, the carrier gas may be supplied to the chamber 12c together with the precursor gas. The carrier gas may be continuously introduced into the chamber 12c in the sub-process S31, the sub-process S32, the sub-process S33, and the sub-process S34. In the subsequent sub-process S32, the chamber 12c is purged as in the sub-process S12. In the subsequent sub-process S33, the hydrogen-containing gas is introduced into the chamber 12c as in the sub-process S13. In the subsequent sub-process S34, the chamber 12c is purged as in the sub-process S14. In the subsequent process S35, determination is made as to whether the stop condition is satisfied. The stop condition is satisfied if the third cycle CY3 has been performed a predetermined number of times. When it is determined in the process S35 that the stop condition is not satisfied, the third cycle CY3 is repeated from the sub-process S31. Meanwhile, if the stop condition is satisfied, the process ST3 is terminated.

As shown in FIG. 5, a pressure in the chamber 12c when the third cycle CY3 is performed is set to a pressure higher than the pressure in the chamber 12c when the second cycle CY2 is performed. The pressure in the chamber 12c when the third cycle CY3 is performed may be equal to or different from the pressure in the chamber 12c when the first cycle CY1 is performed. By performing the aforementioned third cycle CY3, it is possible to limit damage to the base and to increase a formation rate of the tungsten layer WL.

In one embodiment, as shown in FIG. 5, the length of the gap between the stage 24 and the wall surface 16f when the third cycle CY3 is performed is set to a distance longer than the length of the gap between the stage 24 and the wall surface 16f when the second cycle CY2 is performed. The length of the gap between the stage 24 and the wall surface 16f when the third cycle CY3 is performed may be equal to or different from the length of the gap between the stage 24 and the wall surface 16f when the first cycle CY1 is performed.

In one embodiment, as shown in FIG. 5, a temperature of the substrate SB (a temperature of the stage 24) when the third cycle CY3 is performed is set to a temperature higher than the temperature of the substrate SB (the temperature of the stage 24) when the second cycle CY2 is performed. The temperature of the substrate SB (the temperature of the stage 24) when the third cycle CY3 is performed may be equal to or different from the temperature of the substrate SB (the temperature of the stage 24) when the first cycle CY1 is performed.

Further, in one embodiment, as shown in FIG. 5, a flow rate of the carrier gas when the third cycle CY3 is performed is set to a flow rate smaller than the flow rate of the carrier gas when the second cycle CY2 is performed. The flow rate of the carrier gas when the third cycle CY3 is performed may be equal to or different from the flow rate of the carrier gas when the first cycle CY1 is performed.

In addition, in one embodiment, as shown in FIG. 5, a flow rate of the purge gas when the sub-process S32 and the sub-process S34 are performed is set to a flow rate smaller than the flow rate of the purge gas when the sub-process S22 and the sub-process S24 are performed. The flow rate of the purge gas when the sub-process S32 and the sub process S34 are performed may be equal to or different from the flow rate of the purge gas when the sub process S12 and the sub process S14 are performed.

After the process ST3 is performed, a final product W3 shown in FIG. 8 is obtained. As shown in FIG. 8, by performing the process ST3, the thickness of the tungsten layer WL is further increased so that the recesses RC are completely filled with tungsten. The first cycle CY1, the second cycle CY2 and the third cycle CY3 in the method MT are film-forming processing performed by atomic layer deposition. Thus, the method MT does not include etching. Therefore, the method MT can efficiently fill the recesses RC with tungsten.

Hereinafter, ranges of various conditions that can be set in each of the first cycle CY1, the second cycle CY2 and the third cycle CY3 will be exemplified.

<Ranges of Various Conditions in the First Cycle CY1>
Flow rate of the precursor gas in the process S11: 10 sccm to 120 sccm
Flow rate of the purge gas in the process S12: 1,000 sccm to 10,000 sccm
Flow rate of the hydrogen-containing gas in the process S13: 3,000 sccm to 10,000 sccm
Flow rate of the purge gas in the process S14: 1,000 sccm to 10,000 sccm
Flow rate of the carrier gas in the first cycle CY1: 100 sccm to 2,000 sccm
Pressure in the chamber 12c in the first cycle CY1: 2,000 Pa to 5,000 Pa
Length of the gap between the stage 24 and the wall surface 16f in the first cycle CY1: 8 mm to 15 mm
Temperature of the substrate SB (temperature of the stage 24) in the first cycle CY1: 500 degrees C. to 600 degrees C.

<Ranges of Various Conditions in the Second Cycle CY2>
Flow rate of the precursor gas in the process S21: 10 sccm to 120 sccm
Flow rate of the purge gas in the process S22: 7,000 sccm to 16,000 sccm
Flow rate of the hydrogen-containing gas in the process S23: 3,000 sccm to 10,000 sccm
Flow rate of the purge gas in the process S24: 7,000 sccm to 16,000 sccm
Flow rate of the carrier gas in the second cycle CY2: 1,000 sccm to 3,000 sccm
Pressure in the chamber 12c in the second cycle CY2: 100 Pa to 3,500 Pa
Length of the gap between the stage 24 and the wall surface 16f in the second cycle CY2: 3 mm to 10 mm
Temperature of the substrate SB (temperature of the stage 24) in the second cycle CY2: 450 degrees C. to 550 degrees C.

<Ranges of Various Conditions in the Third Cycle CY3>
Flow rate of the precursor gas in the process S31: 10 sccm to 120 sccm
Flow rate of the purge gas in the process S32: 1,000 sccm to 10,000 sccm
Flow rate of the hydrogen-containing gas in the process S33: 3,000 sccm to 10,000 sccm
Flow rate of the purge gas in the process S34: 1,000 sccm to 10,000 sccm
Flow rate of the carrier gas in the third cycle CY3: 100 sccm to 2,000 sccm
Pressure in the chamber 12c in the third cycle CY3: 2,000 Pa to 5,000 Pa
Length of the gap between the stage 24 and the wall surface 16f in the third cycle CY3: 8 mm to 15 mm
Temperature of the substrate SB (temperature of the stage 24) in the third cycle CY3: 500 degrees C. to 600 degrees C.

Although various embodiments have been described above, the present disclosure is not limited to the aforementioned embodiments and various modified embodiments may be implemented. For example, the method MT includes the third cycle CY3 but the third cycle CY3 may be omitted, and the recesses RC may be filled with tungsten by performing the first cycle CY1 at least once and performing the second cycle CY2 at least once.

As described above, according to the present disclosure, it is possible to limit the occurrence of defects while improving efficiency in filling the recesses with tungsten.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of filling recesses in a substrate with tungsten, comprising:
preparing the substrate within a chamber of a film forming apparatus;
performing a first cycle at least once, the first cycle comprising introducing a tungsten-containing precursor gas into the chamber, purging the chamber, introducing a hydrogen-containing gas into the chamber, and purging the chamber; and
performing a second cycle at least once after the first cycle is performed at least once, the second cycle comprising introducing the tungsten-containing precursor gas into the chamber, purging the chamber, introducing the hydrogen-containing gas into the chamber, and purging the chamber;
wherein a pressure in the chamber when the second cycle is performed is set to a pressure lower than a pressure in the chamber when the first cycle is performed, and a mean free path in the chamber when the second cycle is performed is greater than a mean free path in the chamber when the first cycle is performed.

2. The method of claim 1, wherein the film forming apparatus comprises:
a chamber main body configured to provide the chamber; and
a stage provided in the chamber and configured to mount the substrate thereon,
wherein the chamber main body comprises a wall surface extending over the stage and facing an upper surface of the stage, and
a distance between the stage and the wall surface when the second cycle is performed is set to a distance shorter than a distance between the stage and the wall surface when the first cycle is performed.

3. The method of claim 1, wherein a temperature of the substrate when the second cycle is performed is set to a temperature lower than a temperature of the substrate when the first cycle is performed.

4. The method of claim 1, wherein a flow rate of a carrier gas introduced into the chamber when the second cycle is performed is set to a flow rate larger than a flow rate of the carrier gas introduced into the chamber when the first cycle is performed.

5. The method of claim 1, wherein a flow rate of an inert gas introduced into the chamber when the chamber is purged in the second cycle is set to a flow rate larger than a flow rate of the inert gas introduced into the chamber when the chamber is purged in the first cycle.

6. The method of claim 1, further comprising performing a third cycle at least once after the second cycle is performed at least once, the third cycle comprising introducing the tungsten-containing precursor gas into the chamber, purging the chamber, introducing the hydrogen-containing gas into the chamber, and purging the chamber, wherein a pressure in the chamber when the third cycle is performed is set to a pressure higher than a pressure in the chamber when the second cycle is performed.

7. The method of claim 6, wherein the film forming apparatus comprises:
   a chamber main body configured to provide the chamber; and
   a stage provided in the chamber and configured to mount the substrate thereon,
   wherein the chamber main body comprises a wall surface extending over the stage and facing an upper surface of the stage, and
   a distance between the stage and the wall surface when the second cycle is performed is set to a distance shorter than a distance between the stage and the wall surface when the first cycle is performed and a distance between the stage and the wall surface when the third cycle is performed.

8. The method of claim 6, wherein a temperature of the substrate when the second cycle is performed is set to a temperature lower than a temperature of the substrate when the first cycle is performed and a temperature of the substrate when the third cycle is performed.

9. The method of claim 6, wherein a flow rate of a carrier gas introduced into the chamber when the second cycle is performed is set to a flow rate larger than a flow rate of the carrier gas introduced into the chamber when the first cycle is performed and a flow rate of the carrier gas introduced into the chamber when the third cycle is performed.

10. The method of claim 6, wherein a flow rate of an inert gas introduced into the chamber when the chamber is purged in the second cycle is set to a flow rate larger than a flow rate of the inert gas introduced into the chamber when the chamber is purged in the first cycle and a flow rate of the inert gas introduced into the chamber when the chamber is purged in the third cycle.

11. The method of claim 1, wherein the precursor gas contains a tungsten halide.

12. The method of claim 11, wherein the tungsten halide is $WCl_6$, $WCl_5$ or $WF_6$.

* * * * *